United States Patent [19]

Caggiano

[11] Patent Number: 5,442,299
[45] Date of Patent: Aug. 15, 1995

[54] PRINTED CIRCUIT BOARD TEST FIXTURE AND METHOD

[75] Inventor: Raymond J. Caggiano, Charlotte, N.C.

[73] Assignee: International Business Machines Corporation, Armonk, N.Y.

[21] Appl. No.: 178,181

[22] Filed: Jan. 6, 1994

[51] Int. Cl.⁶ .................. G01R 1/073; G01B 11/00
[52] U.S. Cl. ...................... 324/758; 324/761; 356/401
[58] Field of Search ............... 324/758, 754, 761; 356/400, 401; 33/645; 430/30

[56] References Cited

U.S. PATENT DOCUMENTS

| | | | |
|---|---|---|---|
| 4,183,609 | 1/1980 | Luna | 324/761 |
| 4,820,975 | 4/1989 | Diggle | 324/758 |
| 4,864,227 | 9/1989 | Sato | 324/758 |
| 4,929,893 | 5/1990 | Sato et al. | 324/758 |
| 5,150,041 | 9/1992 | Eastin et al. | 324/758 |
| 5,300,881 | 4/1994 | Ferrer et al. | 324/754 |

*Primary Examiner*—Ernest F. Karlsen
*Attorney, Agent, or Firm*—Richard M. Goldman

[57] ABSTRACT

Disclosed is a test system for printed circuit boards and more particularly a test system having machine vision locating of the printer circuit board above the tester, and telescoping test probe pins extending through a multilayer test probe pin guide. Also disclosed is a method of testing printed circuit boards using the test system.

2 Claims, 2 Drawing Sheets

PRINTED CIRCUIT BOARD TEST FIXTURE AND METHOD

FIELD OF THE INVENTION

This invention described herein relates to testers for printed circuit boards and more particularly to testers having machine vision locating of the printer circuit board above the tester, and telescoping test probe pins extending through a multilayer test probe pin guide.

BACKGROUND OF THE INVENTION

The assembly and population of a printed circuit board requires many placement, soldering, and other process steps. Therefore testing and inspection are vital to the econmical fabrication of a high quality product. This is especially true as chip circuit densities, I/O densities, and surface mount technologies drive up printed circuit board circuit loadings. Faults can have their origin in the component chips and bare boards, in component insertion, or in soldering. The faults themselves can be wrong values or labels, poor circuit performance, open circuits, short circuits, components in the wrong position, physical damage, improper solder, damaged or open lands, or out of tolerance faults.

Faults in surface mount technology packages frequently occur because the components are held in place by solder paste, glues, or temporary adhesives until solder reflow. During the interval between placement and reflow, lateral movement of as little as 0.025 inch and rotation of as little as 2.5° from true orthogonal can both have catastrophic effects. Moreover, in surface mount technology, where a good solder joint requires that the solder joint fillet have a meniscus covering both the surface pad and the IC chip pad or lead, the presence of pad oxidation, pad contamination, or raised leads can all give rise to bad solder joints.

Faults in wave soldered plated through hole mounted components can occur during wave soldering. These faults can result in interpin shorts. In wave soldered plated through hole mount components a good soldered joint is charatcetrized by solder fillet having a meniscus that substantially covers the copper land and the plated through hole. Problems can arise through solder shortage, solder excess, voids, blowholes, and no solder.

one way of testing for defects is with contact testers, such as short testers, manufacturing defect analyzers, functional testers, in-circuit testers, and combination testers. Contact testers operate through the use of a mechanical system that pulls the populated printed circuit board down onto the probes so that the individual probes pins act as a bed of nails, contacting all of the test points on the printed circuit board. Some contact fixtures have as many as two thousand or three thousand or more probe pins.

Current test fixture fabrication practice involves the construction of a box which forms the framework of the fixture. Two plates are contained in the box, a stationary plate and a vertically movable plate, parallel to the stationary plate. The stationary plate, called the probe plate, contains the many probe pins. These probe pins contact the circuit under test. The test probes or probe pins are spring loaded devises which make contact with the device under test.

The spring loaded probe pin is installed in a socket which is positioned in the probe plate by holes which are drilled to correspond to the test point pattern of the board to be tested.

The top movable plate supports the board to be tested, which is located by tooling pins. This top plate has clearance holes which allow the test probes to pass through it and contact test locations on the board under test.

In this approach the additive nature of the tolerances involved in both fixture fabrication and board fabrication limit the minimum test target or contact size to about 0.030 inch diameter. Tolerance accumulations occur on the boards itself in drilling of board tooling holes and circuit via holes, as well as circuit pattern and component placement artwork registration. Tolerance is accumulated in the test fixture locating pin size and position, test probe locational accuracy, in addition to probe insertion angularity and pointing accuracy.

OBJECTS OF THE INVENTION

Thus it is a primary purpose of the invention to limit and even, insofar as possible, eliminate the additive nature of the tolerances involved in both fixture fabrication and board testing.

It is a further object of the invention to enable the use of a minimum test target or contact size below about 0.030 inch diameter.

It is a still further object of the invention reduce the tolerances accumulated in the test fixture locating pin, that is, in test fixture locating pin sizing and positioning, test probe locational accuracy, test insertion angularity, and pointing accuracy.

SUMMARY OF THE INVENTION

The invention described herein relates to a method of testing populated printed circuit boards and boards for circuit integrity.

According to the method and system of the invention it is now possible to limit and even substantially eliminate the additive nature of the tolerances involved in both fixture fabrication and board testing.

It is also possible according to the method and system of the invention to enable the use of a minimum test target or contact size below about 0.030 inch diameter.

It is also possible according to the method of the invention the invention reduce the tolerances accumulated in the test fixture locating pin, that is, in test fixture locating pin sizing and positioning, test probe locational accuracy, test insertion angularity, and pointing accuracy.

According to the method described herein a printed circuit board having interconnects which are to be tested for interconnect integrity and a plurality of positioning fiducials is tested in a testing fixture. According to the method of the invention the printed circuit board or card is placed in the printed circuit board holder of the printed circuit board test fixture. The positioning fiducials are located by the use of a fiber optic machine vision. The interconnects to be tested are contacted with pin probes. These pin probes extend outwardly from a pin probe plate through a multi-layer pin probe guide to the printed circuit board under test.

The testing process is carried out in the tester for interconnect testing of a printed circuit board. The printed circuit board is populated with devices such as integrated circuit chips or analog devices. The printed circuit board also has a plurality of positioning fiducials.

The tester includes a fixture, a pin probe plate, with pin probes extending outwardly therefrom toward the printed circuit board under test, a printed circuit board holder for carrying the printed circuit board under test, and a multi-layer pin probe guide interposed between the pin probe plate and the circuit board holder.

THE FIGURES

The invention may be understood by reference to the FIGURES appended hereto.

DETAILED DESCRIPTION OF THE INVENTION

Figure 1:
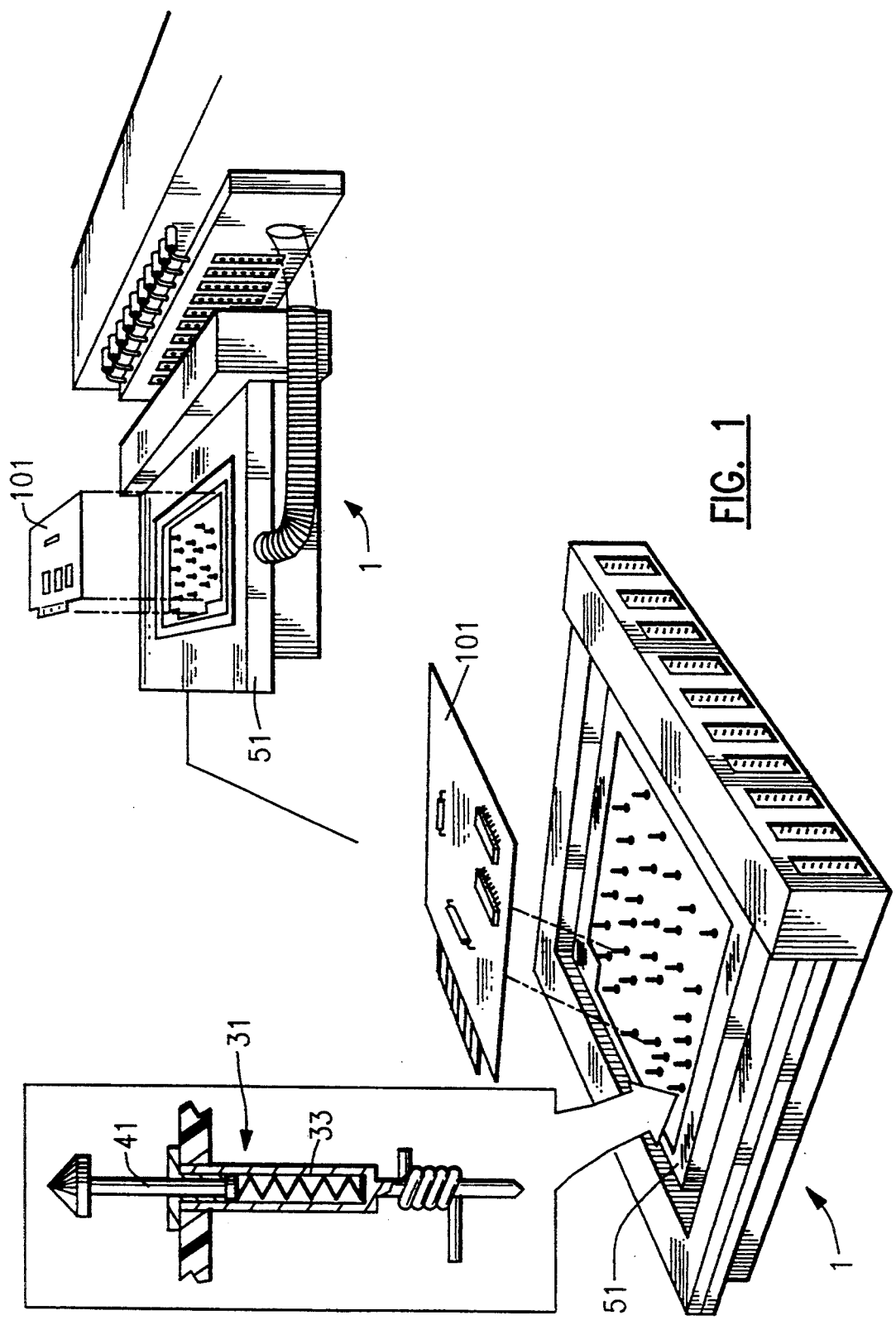
FIG. 1 is an overview of a board testing fixture.
Figure 2:
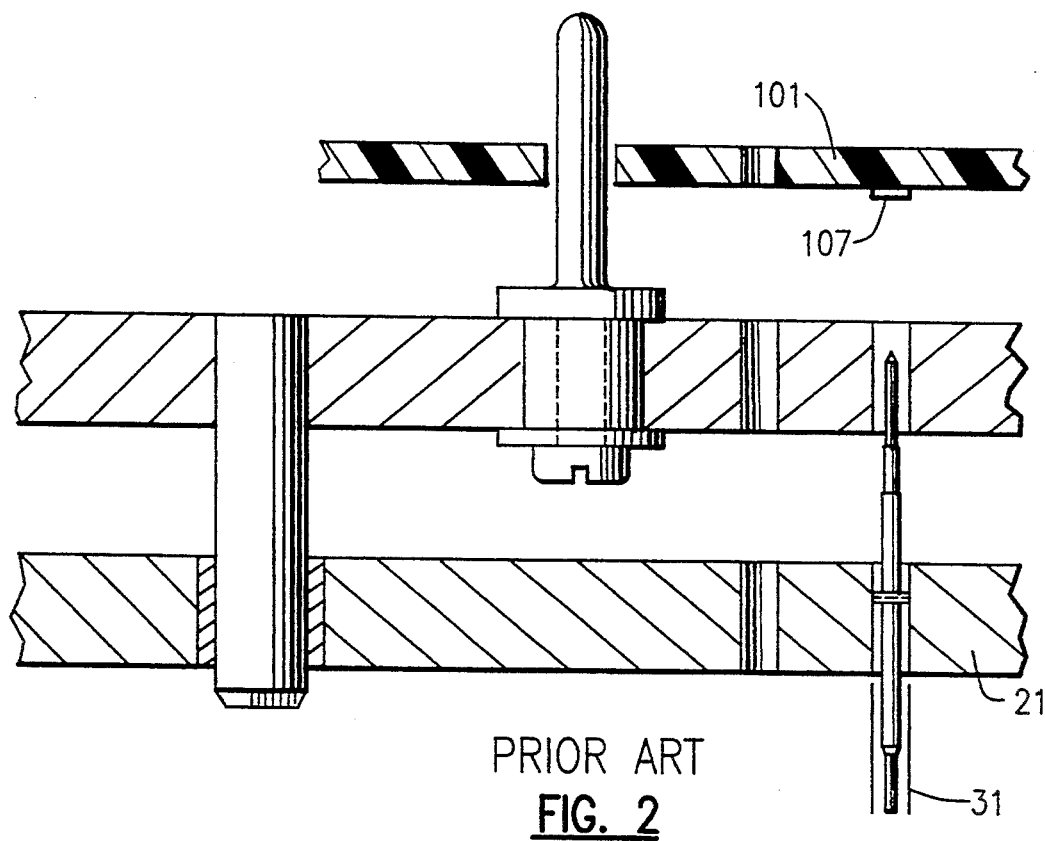
FIG. 2 is a cutaway, side elevation of a testing fixture of the prior art.
Figure 3:
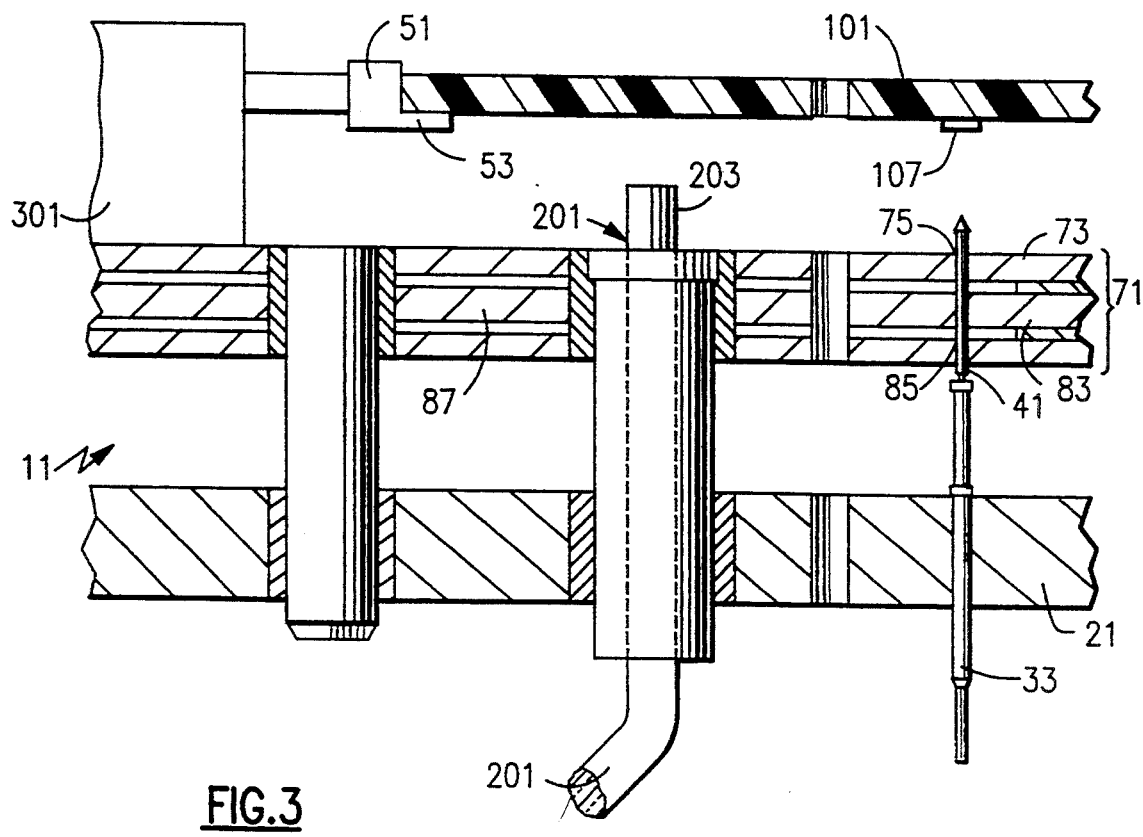
FIG. 3 is a cutaway, side elevation of a testing fixture of the invention.

The invention described herein relates to a method of testing populated printed circuit boards and cards for circuit integrity.

The system and method of the invention resides in the combination of optical alignment of the printed circuit board under test 101 with the test probe pins 31, solid test probe pins 31, and a multilayer test probe guide plate 71. The multilayer test probe guide plate 71 reduces test target area requirements, that it it reduces the mimimum size of the test points 105 on the surface of the printed circuit board 101 under test.

According to the method described herein a printed circuit board 101 having interconnects 107 which are to be tested for interconnect integrity and a plurality of positioning fiducials 105 is tested in a testing fixture 1. According to the method of the invention the printed circuit board or card 101 is placed in a printed circuit board holder 51 of the printed circuit board test fixture 1. The positioning fiducials 105 are located by the use of a fiber optic machine vision 201 system. The interconnects 107 to be tested are contacted with pin probes 31. These pin probes 31 extend outwardly from a pin probe plate 21 to the printed circuit board 101 under test.

The pin probes 31 are movably extendable, and each of the pin probes 31 has an annular, fixed body portion 33 extending outwardly from the pin probe plate 21 toward and facing the printed circuit board 101 under test, and a movable upper body portion 41 extending outwardly from the fixed body portion longitudinally to the printed circuit board 101 under test.

The individual pin probes 31 each extend through a multilayer pin probe guide 71 that is interposed between the pin probe plate 21 and the printed circuit board holder 51. Each layer 73, 83 of the pin probe guide 71 has a plurality of apertures 75, 85 therethrough. These apertures 75, 85 correspond to the individual pin probes 31 with the individual pin probes 31 telescopically movably extending through the corresponding individual apertures 75, 85.

The testing process is carried out in the tester 1 for interconnect testing of a printed circuit board 101. The printed circuit board 101 is populated with devices 103 such as integrated circuit chips 103' or analog devices 103". The printed circuit board 101 also has a plurality of positioning fiducials 105.

The tester 1 includes a fixture 11, a pin probe plate 21, with pin probes 31 extending outwardly therefrom toward the printed circuit board 101 under test, a printed circuit board holder 51 for carrying the printed circuit board 101 under test, and a multi-layer pin probe guide 71 interposed between the pin probe plate 21 and the circuit board holder.

The fixture 11 carries the pin probe plate 21, the printed circuit board holder 51, the multi-layer pin probe guide 71, and the pin probe plate 21.

The pin probe plate 21 has a plurality of pin probes 31 for making electrical contact with interconnects 107 to be tested on the printed circuit board 101. Each of the pin probes 31 has an annular, fixed body portion 33 extending outwardly from the pin probe plate 21 toward and facing the printed circuit holder 51 and the printed circuit board 101 under test. Each of the pin probes also includes a movable upper body portion 41 extending outwardly from the fixed body portion 33 longitudinally toward the printed circuit board holder 51 and the printed circuit board 101 under test.

The pin probe 31 arrangement is a stacked probe arrangement. Holes are drilled in the top plate 51, i.e., the printed circuit board or card holder 51, to accomodate a solid spring probe design, with the spring probe pin immediately below the top plate 51 of the prior art. This allows much tighter control of hole diameters and also puts all drilling tolerances on the same plate, reducing accumulation of tolerances. In addition the contact forces are translated to the bottom psring probe plate 21. Thus, probe plate 21 deflections, caused by high probe forces, which can result in angular probe 31 movement, do not affect the solid probe locations.

The printed circuit board holder 51 rigidly holds a printed circuit board 101 that is under test. This can be accomplished with clamps 53.

The multilayer pin probe guide 71 is interposed between the pin probe plate 21 and the printed circuit board holder 51. The multilayer pin probe guide 71 has at least two layers 73, 83. Each layer 73, 83, of the multilayer pin probe guide 71 has a plurality of apertures 75, 85, extending therethrough. These apertures 75, 85, correspond to individual pin probes 31. The individual pin probes 31 extend through a pair of corresponding individual apertures 75, 85.

The multilayer pin probe guide plate 71 containes two or more individual plates 73, 83 separated by spacers 85. The provision of two thin plates instead of one thick plate eliminates or greatly reduces the effect of angularity and drill wander. Drill wander that occurs in drilling the thick plates of the prior art, typically 0.375 inch or greater in thickness, creates an angular hole that causes the pin probes 31 to be off position, at an angle, when inserted. By utilizing relatively thin plates, e.g., on the order of 0.125 inch thick, or even thinner, the holes 73, 83 can be kept in alignment, and the combined probe pin guide plate thickness, i.e., the cumulative thickness of the individual plates 73, 83, and the spacer, 85 can be as thick the prior art single plate, or even thicker, e.g., 0.375 inch or more.

The tester 1 has fiber optic machine vision means 201 for locating fiducials 105 of the printed circuit board 101 under test. The fiber optic machine vision means 201 include a lens assembly 203. The fiber optic machine vision alignment system 201 can utilize video equipment in combination with fiber optics, to view board fiducials 105. Board fiducials 105 are produced, typically, in the same manufacturing sequence as the test points 107. This process is independent of drilling operations. Optical alignment of fiducials 105 eliminates the effects of registration tolerance accumulation between drilling and artwork applications in board manufacturing. This system includes fiber optic bundles 205 positioned to view board fiducials 105 from the same side as the board 101 probe contact points 107, and thereby allows more accurate positining of the board.

Lateral movement means 201 are incorporated into the printed circuit board holder 51. These lateral movement means 201 are adapted for moving the printed circuit board holder 51 responsive to the fiber optic machine vision means 201. This is to enable locating the fiducials 105 and thereafter laterally moving the printed circuit board holder 51 and the printed circuit board 101 under test to position the interconnects directly above the pin probes 31.

Thus, according to the teachings of my invention, it is possible to limit and even substantially eliminate the additive nature of the tolerances involved in both fixture fabrication and board testing.

It is also possible according to the method and system of the invention to enable the use of a minimum test target or contact size below about 0.030 inch diameter, for example, as small as 0.020 inch.

It is also possible according to the method of the invention the invention reduce the tolerances accumulated in the test fixture locating pin, that is, in test fixture locating pin sizing and positioning, test probe locational accuracy, test insertion angularity, and pointing accuracy.

While the invention has been described with respect to certain preferred embodiments and exemplifications, it is not intended to limit the scope of the invention thereby, but solely by the claims appended hereto.

I claim:

1. A tester for interconnect testing of a printed circuit board, said printed circuit board having a plurality of positioning fiducials, said tester comprising:
   a. a fixture;
   b. a pin probe plate having a plurality of pin probes for electrical contacts on the printed circuit board under test;
   c. a printed circuit board holder for rigidly holding a printed circuit board under test;
   d. fiber optic machine vision means for locating fiducials of the printed circuit board under test; and
   e. lateral movement means for moving said printed circuit board holder responsive to the fiber optic machine vision means for locating fiducials, the improvement wherein said tester further comprises:
   f. each of said pin probes comprising:
      i. an annular, fixed body portion extending outwardly from the pin probe plate toward and facing the printed circuit board under test, and
      ii. a movable upper body portion extending outwardly from the fixed body portion longitudinally to the printed circuit board under test; and
   g. a multilayer pin probe guide interposed between the pin probe plate and the printed circuit board holder, each layer of said pin probe guide having a plurality of apertures therethrough corresponding to individual pin probes, said individual pin probes extending through the corresponding individual apertures.

2. A method of testing a printed circuit board having interconnects to be tested for interconnect integrity and a plurality of positioning fiducials, said method comprising:
   a. placing the printed circuit board in printed circuit board holder means of a printed circuit board test fixture;
   b. locating the positioning fiducials with fiber optic machine vision means for locating fiducials of the printed circuit board under test;
   c. contacting the interconnects to be tested with pin probes extending outwardly from a pin probe plate to the printed circuit board under test, the improvement wherein
   d. each of said pin probes comprises:
      i. an annular, fixed body portion extending outwardly from the pin probe plate toward and facing the printed circuit board under test, and
      ii. a movable upper body portion extending outwardly from the fixed body portion longitudinally to the printed circuit board under test; and
   e. said pin probes extend through a multilayer pin probe guide interposed between the pin probe plate and the printed circuit board holder, each layer of said pin probe guide having a plurality of apertures therethrough corresponding to individual pin probes, said individual pin probes extending through the corresponding individual apertures.

* * * * *